United States Patent [19]

Takagi et al.

[11] Patent Number: 5,436,559
[45] Date of Patent: Jul. 25, 1995

[54] METHOD FOR TESTING SEMICONDUCTOR DEVICE

[75] Inventors: Ryoichi Takagi; Tetsuo Tada; Koji Tanaka, all of Hyogo, Japan

[73] Assignee: Mitsubishi Denki Kabushiki Kaisha, Tokyo, Japan

[21] Appl. No.: 109,957

[22] Filed: Aug. 23, 1993

Related U.S. Application Data

[62] Division of Ser. No. 805,140, Dec. 11, 1991, abandoned.

[30] Foreign Application Priority Data

Jan. 28, 1991 [JP] Japan .................. 3-008654

[51] Int. Cl.$^6$ .................................. G01R 31/28
[52] U.S. Cl. .................. 324/158.1; 324/765; 371/25.1
[58] Field of Search .............. 324/158.1, 73.1, 765; 371/25.1, 22.1

[56] References Cited

U.S. PATENT DOCUMENTS

| | | | |
|---|---|---|---|
| 3,159,787 | 12/1964 | Sexton et al. | 324/99 R |
| 3,302,109 | 1/1967 | Jones | 371/25.1 |
| 3,636,443 | 1/1972 | Singh et al. | 371/25.1 |
| 3,982,240 | 9/1976 | Waehner | 324/99 D |
| 4,110,698 | 8/1978 | Petrie | 328/164 |
| 4,637,006 | 1/1987 | Bierhoff | 369/59 |
| 4,720,671 | 1/1988 | Tada et al. | 324/73.1 |
| 4,908,802 | 3/1990 | Harvey et al. | 367/76 |

OTHER PUBLICATIONS

Takagi et al, "Improvement of Pulse Waveform on Transmission Line in High Speed LSI Testing", *Institute of Electronics, Information Communication and Electric Engineers*, 1989, pp. 51–58.

Barber et al, "Modern ATE", *IEEE Design & Test*, Apr. 1987, pp. 23–30.

David Royle, "Correct Signal Faults by Implementing Line-Analysis Theory", *Designer's Guide to Transmission Lines & Interconnections, Part Two*, 1988, pp. 143–148.

Barber et al, "Timing Measurements on CMOS VLSI Devices Designed to Drive TTL Loads", *IEEE 1986 International Test Conference*, 1986, 161–186.

*Primary Examiner*—Ernest F. Karlsen
*Attorney, Agent, or Firm*—Lowe, Price, LeBlanc & Becker

[57] ABSTRACT

A method of testing a semiconductor device operating according to predetermined testing information. An output signal of the semiconductor device is received through a signal transmission line and a reference voltage is generated in accordance with an expected logical level of the output signal. The reference voltage is compared with a voltage of the output signal thus received and a current flow is supplied to the signal transmission line in accordance with the result. A logical level of the output signal thus received is determined and a decision is made whether the semiconductor device operates correctly.

10 Claims, 11 Drawing Sheets

METHOD FOR TESTING SEMICONDUCTOR DEVICE

This application is a division of application Ser. No. 07/805,140 filed Dec. 11, 1991, now abandoned.

BACKGROUND OF THE INVENTION

1. Field of the Invention

The present invention relates generally to testing apparatuses and methods for making functional verification of semiconductor devices, measurement of alternating current characteristics and direct current characteristics of the devices, and the like. More particularly, the invention relates to pin electronics for making electrical connection to pin terminals of a semiconductor device, applying a test signal to the semiconductor device, receiving output signals from the device, making a comparison between outputs and expected values, measuring signal characteristics, and the like.

2. Description of the Background Art

Semiconductor devices undergo various tests in respect of reliabilities. There are two types of tests for the semiconductor devices: a DC/AC characteristic test for measuring direct current (DC) characteristics such as currents or voltages of respective terminals and alternate current (AC) characteristics such as operation frequency and operation timing of the devices; and a functional test (verification) for determining whether or not the semiconductor devices function as designed.

In the DC characteristic test, such characteristics as inputs, outputs, input-to-output transmission, a total current and power consumption are measured. In the AC characteristic test, rising times and falling times of waveforms of input signals and output signals, a delay time in propagation between input and output terminals, a set-up time, a hold time, a minimum clock pulse width, an operation frequency and the like are measured.

The functional test is a test for checking if semiconductor devices operate without indicating any abnormality in its function, when the semiconductor devices have prescribed operating conditions imposed thereon. The functional test is usually carried out by comparing and checking a pattern applied to an output terminal with an expected pattern when a test pattern is applied to an input terminal.

FIG. 1 is a conceptional diagram of functional test of a semiconductor device, particularly a semiconductor integrated circuit device. Referring to FIG. 1, a testing apparatus includes a pattern generator 500 for generating a test pattern, a test pattern applying apparatus 501 for receiving the test pattern from pattern generator 500, to convert the received test pattern into logic signals of logical one or logical zero and apply the signals to an input terminal 510 of a device 502 under test, an output pattern discriminating circuit 504 for receiving an output signal from device 502 under test to convert the received output signal into a logic signal, an expected pattern storing circuit 505 for storing therein expected values of an output pattern corresponding to an input test pattern generated by pattern generator 500, a comparison circuit 506 for making a comparison between an output of output pattern discriminating circuit 504 and an output of expected pattern storing circuit 505, and a determining circuit 507 for determining whether device 502 operates normally, in response to an output of comparison circuit 506.

A power supply pin terminal of device 502 is supplied with a predetermined operating supply voltage from a power supply 503, and a ground terminal of device 502 is connected to a ground potential GND. Various methods for realizing such functional test of semiconductor device have been considered. With regard to generation of a test pattern also, a method for most efficiently creating a test pattern having higher test coverage is considered.

FIG. 2 is a diagram showing one example of a conventional testing method of a semiconductor device and conceptionally showing a test pattern storing method. Referring to FIG. 2, a testing system includes a test pattern generator 550 comprised such as of a logic simulator, and a testing apparatus 551 for receiving an input test pattern and an expected output pattern from test pattern generator 550, applying the input test pattern to a device 560 under measurement and comparing an output response pattern from device 560 with the received expected output pattern, thereby determining pass/fail of device 560.

Testing apparatus 551 includes a memory 555 for storing the input test pattern therein, a memory 556 for storing the expected output pattern from test pattern generator 550, and a comparator 557 for making a comparison between the output response pattern from device 560 and the expected output pattern of memory 556.

In the testing method called the test pattern storing method, an input test pattern and an expected output pattern are created in advance by test pattern generator 550. These input test pattern and expected output pattern are stored in memories 555 and 556 in testing apparatus 551 such as an LSI tester. The input test pattern of memory 555 is applied to device 560 in testing. Device 560 carries out a certain operation in accordance with the applied input test pattern and outputs an output signal indicating results of the operation as an output response pattern. Comparator 557 included in testing apparatus 551 compares the output response pattern from device 560 with the expected output pattern stored in memory 556. If this expected output pattern matches the output response pattern, then it is determined that device 560 operates normally. Conversely, if the expected output pattern mismatches the output response pattern, then it determined that there is a failure in device 560. Analyzing the input test pattern generated by test pattern generator 550 also allows a fault diagnosis (an analysis of the failure, or the like).

In such a testing apparatus, a card (board) which is called pin electronics for applying a signal directly to a device under measurement and receiving the signal therefrom is installed in a test head, one for each pin terminal of a semiconductor device under measurement. The pin electronics is employed not only in a functional testing of a semiconductor device but also in a DC/AC characteristic testing.

FIG. 3 is a diagram showing a schematic structure of a general pin electronics circuit incorporated in a semiconductor testing apparatus. Referring to FIG. 3, a pin electronics circuit 200 includes a driver 201 for applying a voltage waveform to a semiconductor device 206 under test (hereinafter referred to simply as LSI) in accordance with a test pattern, and a comparator 202 for receiving an output signal from the LSI to determine whether a logical value of the received output signal is logical one or logical zero. Pin electronics circuit 200 further includes a switching element 205a for connecting an output of driver 201 to a node 208, and a switching element 205b for connecting the node 208 and an input of comparator 202. One of switching elements 205a and 205b is rendered conductive by a control signal from a control circuit not shown. Node 208 of pin electronics circuit 200 is connected via a transmission line 203 to a terminal 207 of LSI 206. Terminal 207 may be either a signal output terminal or a signal input terminal, or alternatively, a terminal for both inputting and outputting a signal.

Pin electronics circuit 200 further includes a resistor 204 connected via a switching element 205c to node 208. When there is a mismatch between output resistance of an output buffer of LSI 206 and characteristic impedance of transmission line 203, reflection accompanied by undershoot and overshoot is produced in signal waveforms at node 208. In order to inhibit such reflection, resistor 204 is provided as terminating resistance. An operation will now be described.

When pin terminal 207 of LSI 206 is a signal input terminal, only switching element 205a included in pin electronics circuit 200 is turned on in response to an output of the control circuit not shown, so as to connect the output of driver 201 to node 208. A voltage signal in accordance with a test pattern is applied to an input of driver 201. Driver 201 applies a voltage waveform in accordance with this test pattern via node 208 and transmission line 203 to pin terminal 207 of LSI 206. LSI 206 operates in accordance with the voltage signal applied to pin terminal 207.

When pin terminal 207 of LSI 206 is a signal output terminal, only switching element 205b included in pin electronics circuit 200 is turned on. Comparator 202 receives an output signal from pin terminal 207 of LSI 206 via transmission line 203, to convert the received output signal into a signal of logical one or logical zero. Comparator 202 is supplied with an expected output voltage (VOH, VOL) of LSI 206 as a reference value. Based on the applied expected output voltage, comparator 202 discriminates the logic level of the output signal from LSI 206. The logic signal generated by comparator 202 is compared with an expected output pattern. Pass/fail of LSI 206 is determined in accordance with the result of the comparison.

Transmission line 203 has impedance. LSI 206 includes an output buffer circuit as shown in FIG. 4 at its output portion.

FIG. 4 is a diagram showing structure of an output stage of LSI 206. Referring to FIG. 4, LSI 206 includes an internal circuit 250 for performing a predetermined function, and an output buffer circuit 251 for buffering an output signal from internal circuit 250 to transmit the buffered output signal to pin terminal 207. Output buffer circuit 251 includes a p channel MOS (insulated gate type) transistor PT and an n channel MOS transistor NT that are complementary-connected between an operating supply potential Vcc and another supply potential Vss. Transistors PT and NT include a resistance component (ON resistance) R that exists when these transistors are in an ON state.

Output resistance of output buffer circuit 251 contributes as output impedance at pin terminal 207 of LSI 206. When there is a mismatch between the output impedance at pin terminal 207 of LSI 206 and impedance on transmission line 203, reflection of a signal occurs on node 208, so that overshoot and undershoot are generated in this signal. Further, even if the output impedance at pin terminal 207 of LSI 206 matches the impedance on transmission line 203 and hence no reflection occurs, stray capacitance and parasitic inductance exist on transmission line 203, resulting in a ringing of a signal on node 208. In order to inhibit such signal reflection and ringing, when pin terminal 207 is a signal output terminal, switching element 205c as well as switching element 205b is turned on, so that resistor 204 is connected as terminating resistance to node 208. A brief description will now be given on function of terminating resistance 204.

FIG. 5 is a diagram showing a connection in a case in which the transmission line system is unterminating. Referring to FIG. 5, pin terminal 207 of LSI 206 is connected via transmission line 203 to comparator 202. In the connection shown in FIG. 5, when the output impedance (output resistance) at pin terminal 207 is lower than the characteristic impedance of the transmission line, the undershoot and overshoot of a signal is generated on input node 208 of comparator 202. More specifically, comparator 202 has high input impedance, and a voltage signal that is transmitted from pin terminal 207 via transmission line 203 to node 208 undergoes a total reflection at an input terminal of comparator 202. The following relation is obtained:

$$Vc = 2 \cdot Z0 \cdot V/(Z+Z0)$$

where the output impedance (output resistance) of pin terminal 207 is Z, the characteristic impedance of transmission line 203 is Z, the output voltage applied to pin terminal 207 is V, and a voltage on node 208 is Vc.

If output impedance Z of pin terminal 207 is lower than characteristic impedance Z0 of transmission line 203, $Vc > V$ is satisfied. That is, the amplitude of the voltage signal on input node 208 of comparator 202 becomes larger than that of the voltage signal at pin terminal 207, so that the undershoot and overshoot of the voltage signal is generated at input node 208. The manner in which the undershoot is generated at node 208 is shown in FIG. 6.

FIG. 6 is a diagram schematically showing a signal waveform obtained when the undershoot is generated at input node 208 of comparator 202. Referring to FIG. 6, a logical high level of an output signal from pin terminal 207 indicates 5 V, while a logical low level of the output signal indicates 0 V. When undershoot occurs in this voltage signal waveform 209, the undershoot causes noise, thereby failing to convert the output signal into a correct logic signal in comparator 202. In addition, when AC characteristics such as a falling time and a rising time of the output signal waveform of LSI 206 are measured, timing errors occur, thereby failing to make an accurate measurement. For accurate measurement in functional testing of LSI 206 under such conditions, it is necessary to measure a signal in the state where ringing is smoothed over, thereby failing to carry out a fast functional verification.

As a method for inhibiting the overshoot, undershoot and ringing caused by reflection at node 208, resistive termination is employed. In the resistive termination, switching element 205c shown in FIG. 3 is turned on, so that resistor 204 is connected between node 208 and potential Vss.

FIG. 7 is a diagram showing a connection configuration of pin electronics and LSI in the use of the resistive termination. Referring to FIG. 7, resistor 204 is connected between node 208 and supply potential Vss (normally ground potential 0 V). Assume that a resistance value of resistor 204 is RT. At pin terminal 207 of LSI 206, there exists output resistance R due to ON resistance of transistors PT and NT included in output buffer circuit 251 shown in FIG. 4. Only ON resistance R of p channel MOS transistor PT (see FIG. 4) connected to operating supply potential Vcc is shown in FIG. 7.

FIG. 8 is a diagram showing a voltage waveform on node 208 in the use of the resistive termination. Distorted pulse waveform 209 (see FIG. 6) on node 208 in the case where no resistive termination is carried out is shown as well in FIG. 8. When the logical level of a signal appearing at pin terminal 207 is logical one, a voltage detected by comparator 202 (a voltage on node 208) is obtained by the following relation:

$$Vcc \cdot RT/(R+RT)$$

where a direct current resistance component of transmission line 203 is ignored. As described above, the voltage applied to node 208 is divided by terminating the transmission line by using resistor 204, whereby the generation of undershoot, overshoot and ringing on node 208 can be inhibited.

As apparent from FIG. 8, a voltage waveform 210 on input node 208 of comparator 202, obtained in the resistive termination using resistor 204 is a very smooth waveform as compared to signal waveform 209 on node 208 to which no terminating resistance is connected.

If such resistor 204 is connected to node 208, a current flowing through resistor 204 is obtained by the relation $Vcc/(R+RT)$ when the logical level of an output of LSI 206 is logical one.

When LSI 206 outputs a signal of logical zero to pin terminal 207, n channel MOS transistor NT shown in FIG. 4 is turned on, whereas p channel MOS transistor PT is turned off. This results in such a state that resistor R shown in FIG. 7 is connected to potential Vss (0 V), the voltage on node 208 is Vss (0 V), and the current flowing through resistor 204 is also 0 mA.

A general review of pin electronics is given in "MODERN ATE" by M. R. Barber et al., *IEEE DESIGN & TEST* April 1987, pp. 23-30.

The use of resistive termination to reduce signal ringing caused by impedance mismatching of a general transmission line is described in "Correct Signal Faults by Implementing Line-analysis Theory" by D. Royle, *EDN* Jun. 23, 1988, pp. 143 to 148.

A solution for the undershoot/overshoot problem in pin electronics by providing a series resistor on a transmission line is described in "Timing Measurements on CMOS VLSI DEVICES DESIGNED TO DRIVE TTL LOADS" by M. R. Barber et al., 1986 International Test Conference, *IEEE*, Paper 4.4, pp. 161-168.

In the conventional resistive termination used as a method for inhibiting the generation of overshoot, undershoot and ringing, a current flows through terminating resistance 204 when the logical level of an output of LSI 206 is logical one. This current is supplied via an output transistor from a power supply line of output buffer circuit 251 (see FIG. 4) in LSI 206. This allows an excess current to flow into LSI 206, causing an electromigration problem in an internal interconnection of LSI 206, resulting in a degradation in reliability of LSI 206.

In addition, connecting the resistor 204 to node 208 causes an increase in RC delay on the transmission line and an increase in the rising time and the falling time of the signal waveform on node 208, i.e., an increase in time constant, whereby the output signal waveform is rounded. When the output signal waveform is rounded in this manner, such a problem occurs that even if LSI 206 is operated at an actual operation clock frequency, an accurate output signal cannot be obtained at predetermined timing, and hence no accurate functional testing can be made. Further, another problem arises that no precise measurement can be made in DC/AC characteristic measurements. When a functional testing is carried out with a deviation in measurement timing in consideration of the rounding of the output signal waveform, a fast functional testing for the LSI cannot be carried out, resulting in a longer test time. This problem becomes a greater problem as the LSI operates faster and/or requires a larger number of pin terminals.

SUMMARY OF THE INVENTION

An object of the present invention is therefore to provide an apparatus and method for testing a semiconductor device, which has no disadvantages of a conventional semiconductor testing apparatus and can make a fast, accurate functional verification of an LSI and a fast, accurate measurement of DC/AC characteristics.

A semiconductor testing apparatus according to the present invention includes determination circuitry for receiving at its input an output signal from a semiconductor device under test via a transmission line, to determine a logic value of the output signal, circuitry for generating a reference voltage, and circuitry for making a comparison between an input voltage of the determination circuitry and the reference voltage, to supply a current to the transmission line in accordance with a result of the comparison.

The "supply" of the current includes both operations of injecting charges to the transmission line and discharging the charges from the transmission line.

The current supply circuitry supplies charges to the transmission line in accordance with the input voltage of the determination circuitry. The charge supply is carried out so as to compensate for overshoot and undershoot on the transmission line. A possibility of generating the overshoot and undershoot is discriminated by the comparison between the input voltage of the determination circuitry and the reference voltage in the current supply circuitry. This inhibits the generation of overshoot, undershoot and ringing on the transmission line. Since it is unnecessary to provide terminating resistance, no excess current flows in the semiconductor device under test.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
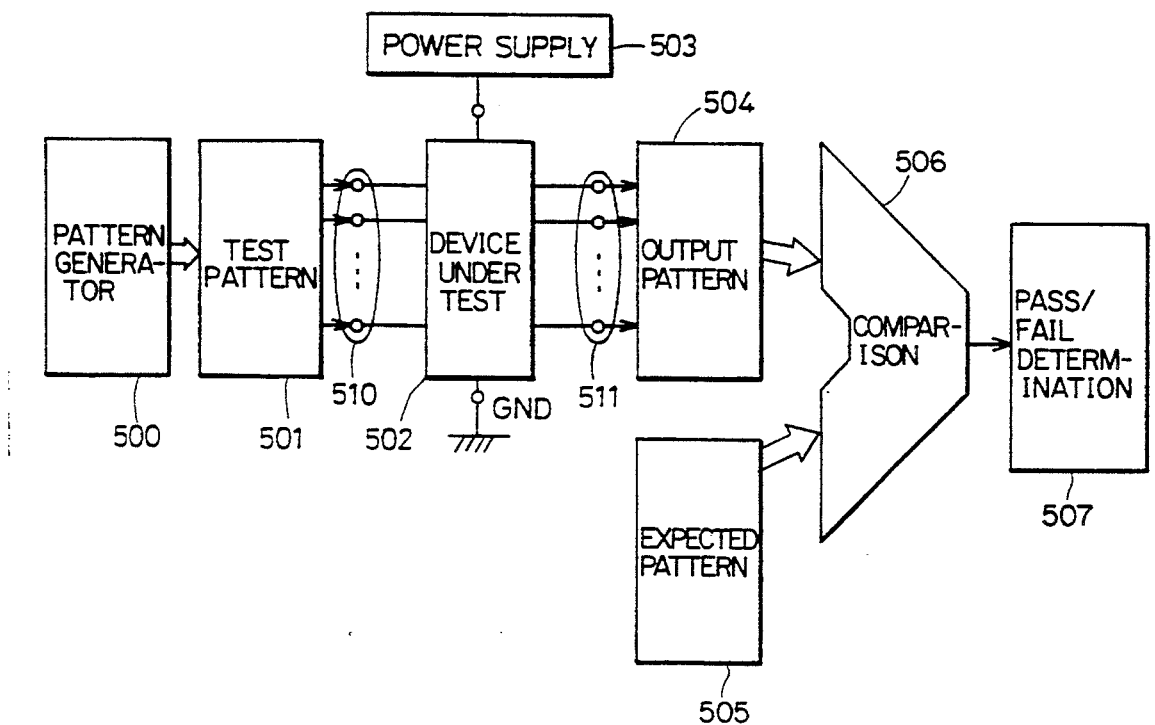
FIG. 1 is a diagram conceptionally showing a functional testing method of a semiconductor device.
Figure 2:
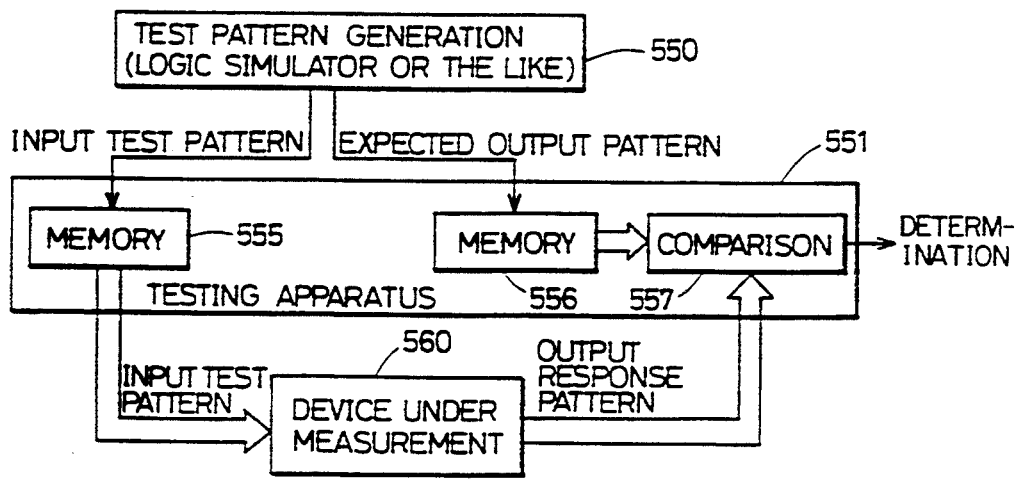
FIG. 2 is a functional block diagram conceptionally showing a test pattern storing method which is one of functional testing methods of a semiconductor device.
Figure 3:
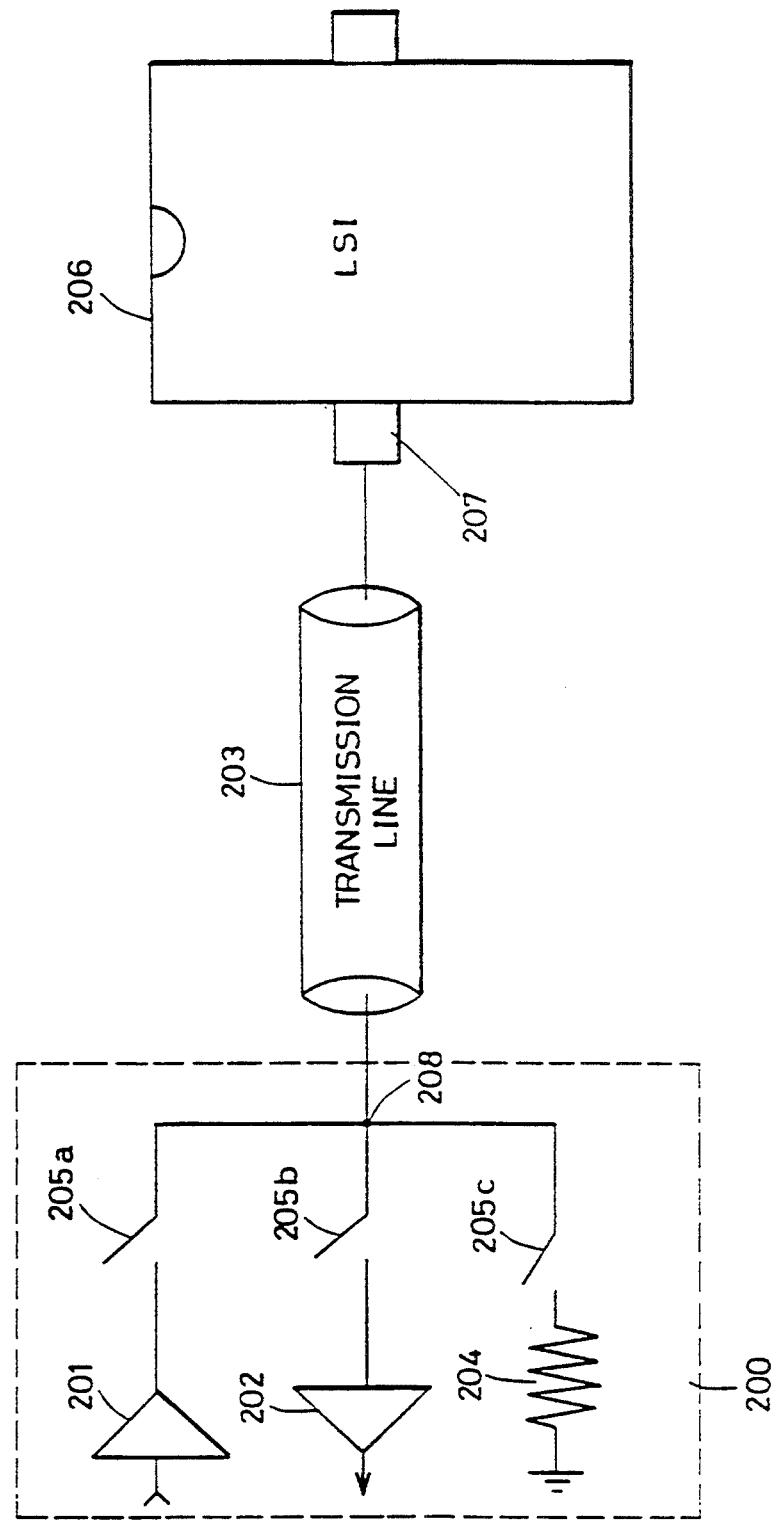
FIG. 3 is a diagram showing structure of a conventional semiconductor testing apparatus and a connecting configuration of the conventional semiconductor testing apparatus and a semiconductor device under test.
Figure 4:
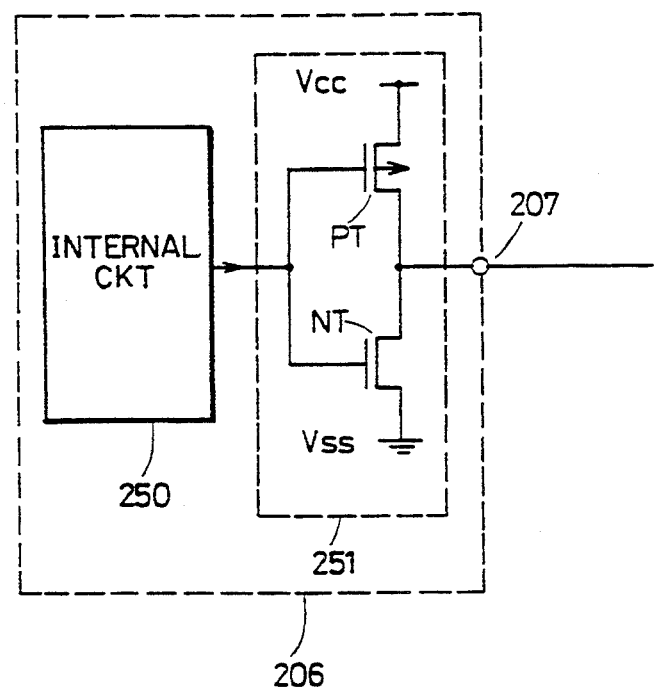
FIG. 4 is a diagram showing one example of structure of an output stage of the semiconductor device under test.
Figure 5:
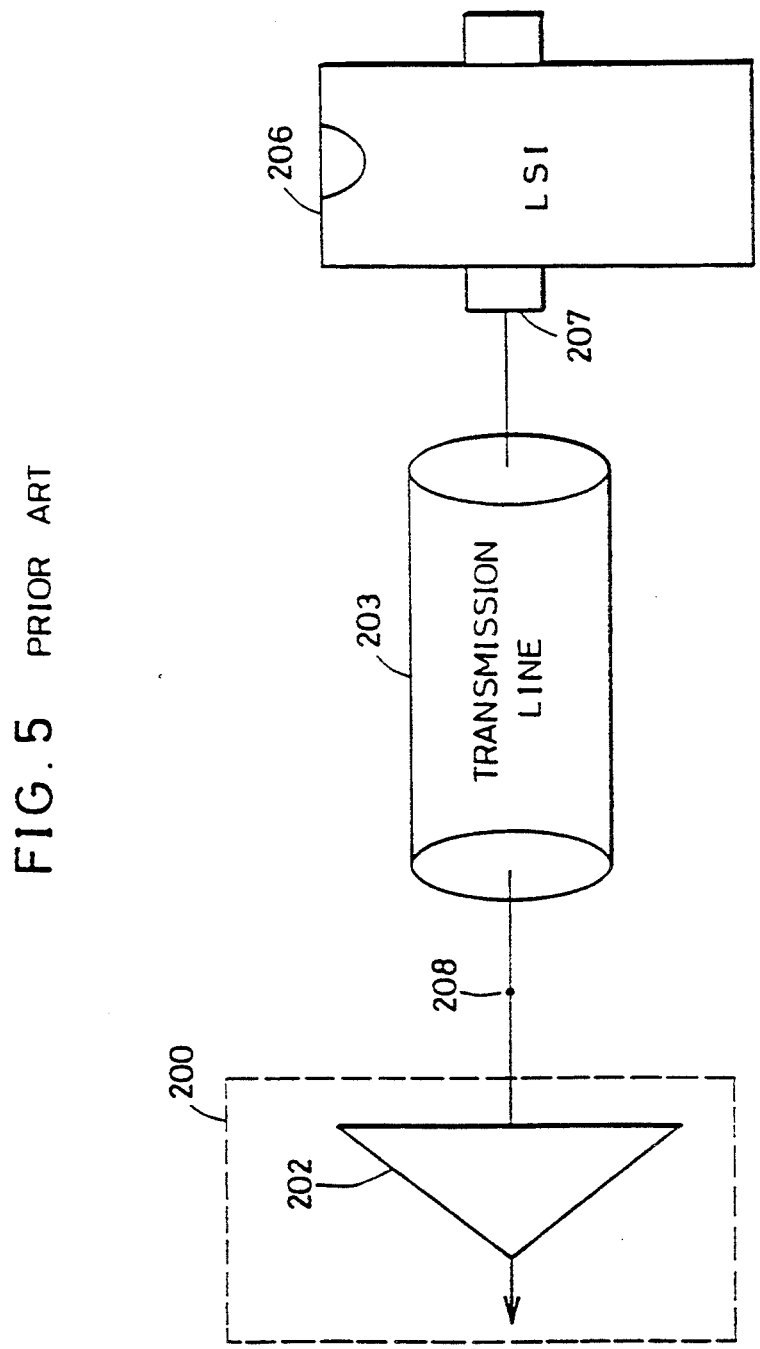
FIG. 5 is a diagram showing one example of a connection between the semiconductor device under test and the semiconductor testing apparatus in the conventional semiconductor testing apparatus.
Figure 6:
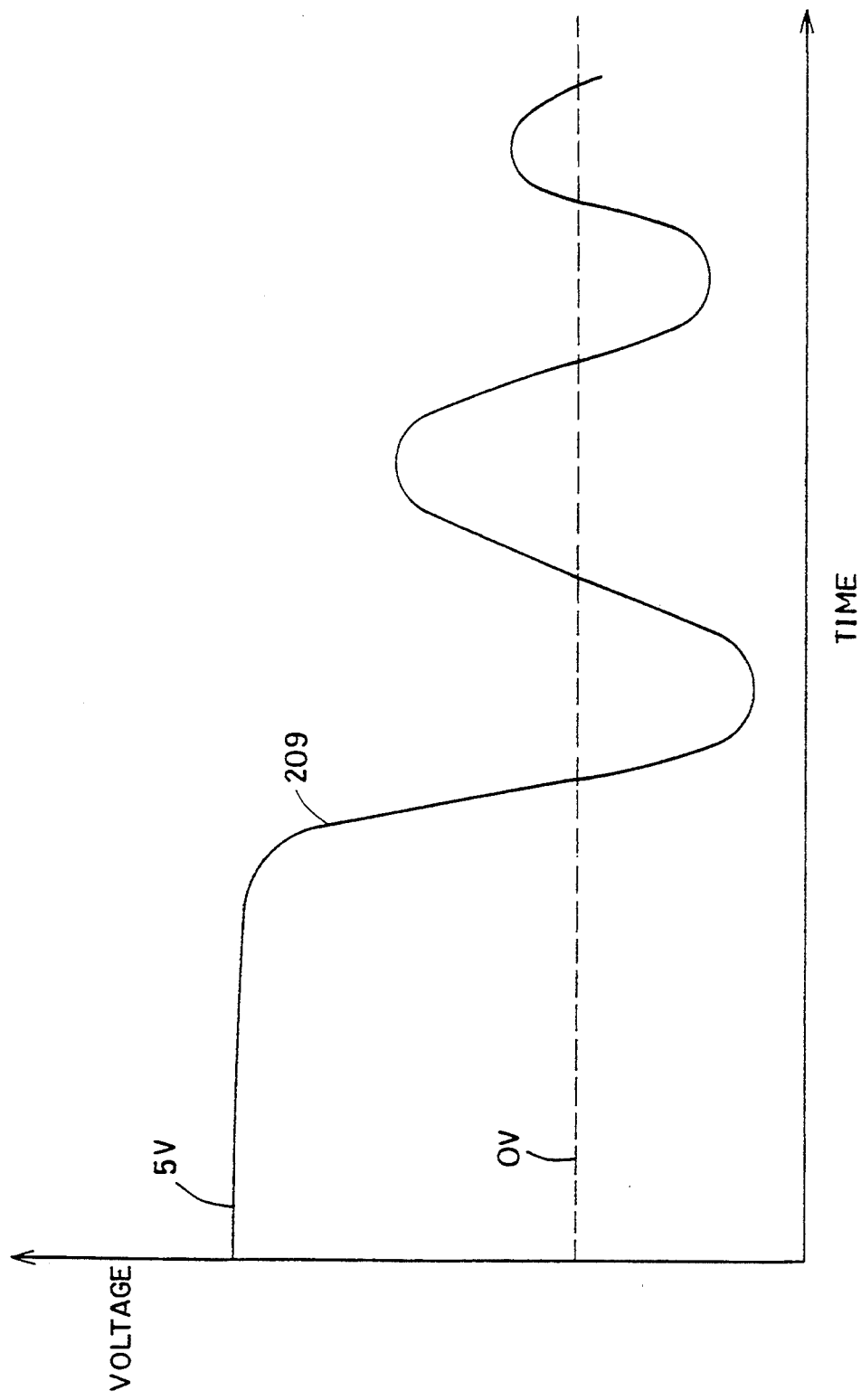
FIG. 6 is a diagram for use in explaining problems occurring in the case of the connection shown in FIG. 5.
Figure 7:
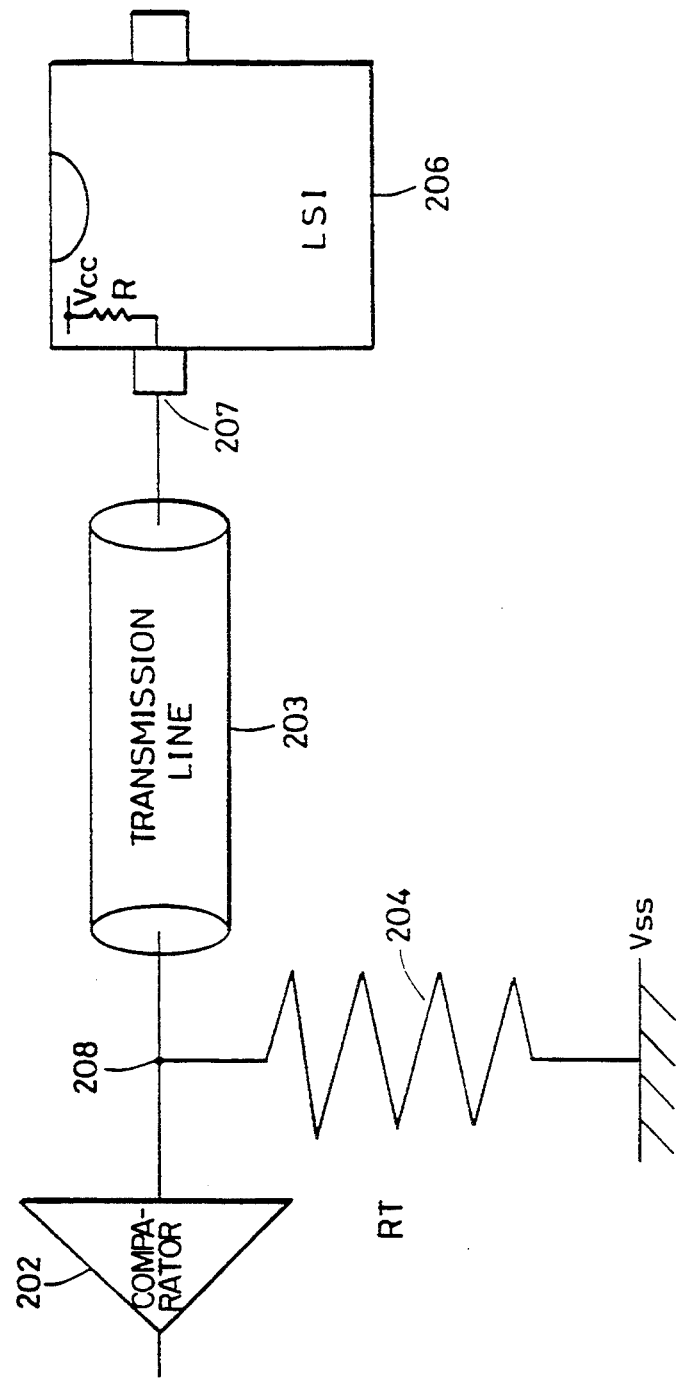
FIG. 7 is a diagram showing a connection configuration using a terminating resistance connecting method in the conventional semiconductor testing apparatus.
Figure 8:
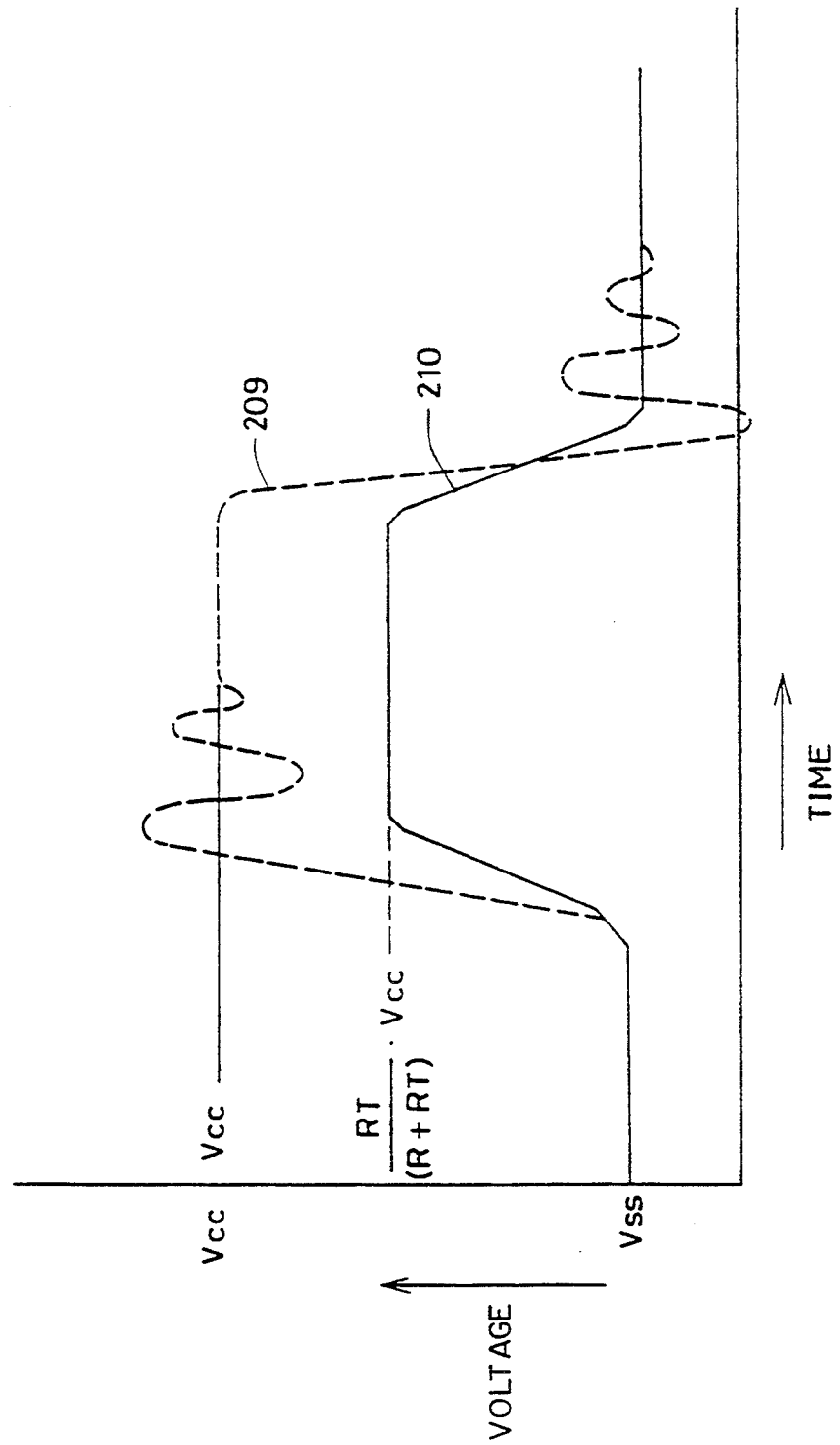
FIG. 8 is a diagram showing a signal voltage waveform at an input terminal of a comparator in the semiconductor testing apparatus using the terminating resistance connecting method shown in FIG. 7.
Figure 9:
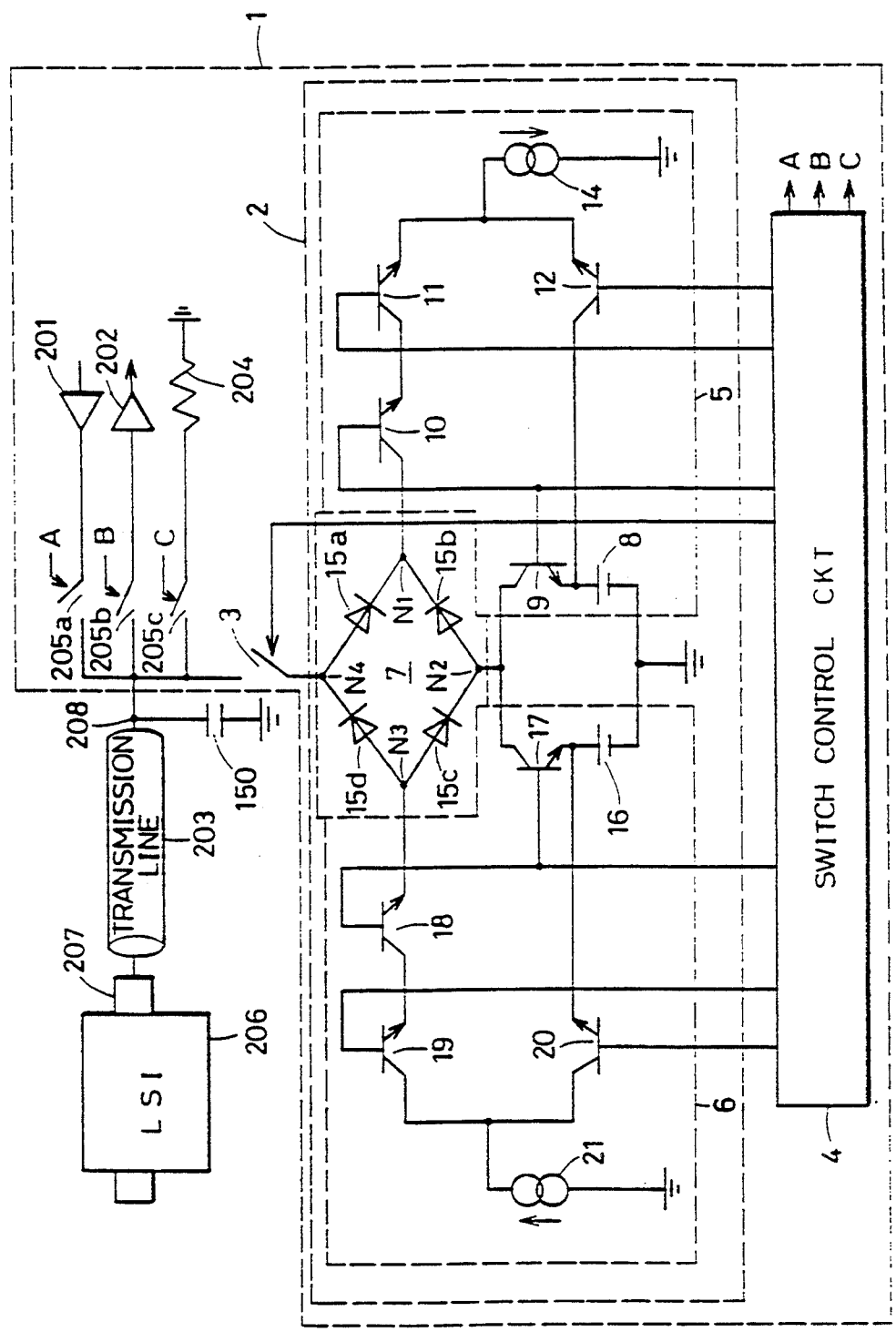
FIG. 9 is a circuit diagram showing structure of a semiconductor testing apparatus according to one embodiment of the present invention.

FIG. 9 is a diagram showing a circuit configuration of pin electronics being one embodiment of the present invention. Circuit components in FIG. 9 corresponding to the conventional circuit components shown in FIG. 3 are denoted with like reference numerals. Referring to FIG. 9, a pin electronics circuit 1 according to the present invention includes in addition to conventional driver 201, comparator 202 and resistor 204, a current supply circuit 2 for supplying a current in accordance with a voltage on node 208, and a switch control circuit 4 for controlling a current supply operation of current supply circuit 2. An output node of current supply circuit 2 is connected via a switching element 3 to node 208. Stray capacitance 150 is associated with a transmission line 203.

Current supply circuit 2 includes a first current supply circuit 5 for preventing generation of overshoot on node 208, a second current supply circuit 6 for preventing generation of undershoot on node 208, and a diode bridge 7 for changing a current supply path of each of first and second current supply circuits 5 and 6 in accordance with a voltage on node 208.

First current supply circuit 5 includes a first reference voltage source 8 for generating a reference voltage for inhibiting overshoot, a fast switching element 9 comprised of, e.g., an NPN bipolar transistor for connecting first reference voltage 8 to diode bridge 7, fast switching elements 10 and 11 each comprised of, e.g., NPN bipolar transistors that are turned on in response to a control signal from switch control circuit 4, for connecting a node N1 of diode bridge 7 to a first constant current source 14, and a fast switching element 12 comprised of, e.g., an NPN bipolar transistor for connecting first reference voltage source 8 to first constant current source 14 in response to a control signal from switch control circuit 4. When overshoot occurs on node 208, first constant current source 14 supplies a current via node 208 onto transmission line 203 (stray capacitance 150) so as to inhibit the overshoot on node 208.

Second current supply circuit 6 includes a second reference voltage source 16 for generating a reference voltage for undershoot on node 208, a fast switching element 17 comprised of, e.g., an NPN bipolar transistor for connecting second reference voltage source 16 to diode bridge 7 in response to a control signal from switch control circuit 4, a second constant current source 21 for supplying a current when undershoot occurs on node 208, fast switching elements 18 and 19 each comprised of, e.g., NPN bipolar transistors that are turned on in response to a control signal from switch control circuit 4, for connecting second constant current source 21 to diode bridge 7, and a fast switching element 20 comprised of, e.g., an NPN bipolar transistor that is turned on in response to a control signal from switch control circuit 4, for connecting second constant current source 21 and second reference voltage source 16.

Diode bridge 7 includes a diode 15a connected forwardly from a node N4 between nodes N4 and N1, a diode 15b connected forwardly from a node N2 between nodes N2 and N1, a diode 15c connected forwardly from a node N3 between nodes N3 and N2, and a diode 15d connected forwardly from node N3 between nodes N3 and N4. Diode bridge 7 changes a current path of constant current source 21 or 14 in accordance with a reference voltage applied by reference voltage source 8 or 16 and a voltage on node 208.

Switch control circuit 4 generates a control signal for controlling operation of each of switches 205a, 205b, 205c, 10, 11, 12, 18, 19 and 20 in accordance with information of a test program or a test pattern of an LSI 206. More specifically, the test program or the test pattern includes such information as an expected pattern as to whether or not pin terminal 207 becomes a signal output terminal and whether an output signal from pin terminal 207 is logical one or logical zero. In accordance with such an expected pattern, it can be informed that there is a possibility of generating overshoot or undershoot on node 208. An operation will now be described.

First, an example of specific values will be given to facilitate a description as to the set current values of respective constant current sources 14 and 21 and the set reference voltages of respective reference voltage sources 8 and 16.

In first current supply circuit 5 for supplying a current for an overshoot countermeasure, a current supplied by first constant current source 14 is set to minus (−) several 10 mA, and first reference voltage source 8 is set to operate at 5.5 V which is higher by 0.5 V than an output voltage of LSI 206 structured in CMOS implementation that is operative at 5 V of a supply voltage. The difference of 0.5 V is made to take into account a voltage drop caused by ON resistance of a diode in diode bridge 7.

In second current supply circuit 6 for an undershoot countermeasure, a constant current supplied by second constant current source 21 is set to several 10 mA, and a reference voltage supplied by second reference voltage source 16 is set to −0.5 V which is lower by 0.5 V than supply potential Vss (0 V) of LSI 206 structured in the CMOS implementation. The voltage difference by 0.5 V is set considering a voltage drop across a diode in diode bridge 7.

Referring to FIG. 9, constant current sources 14 and 21 and reference voltage sources 8 and 16 are implemented on a hardware basis, and its supply currents and its reference voltages are fixed. However, the structure of a voltage/current supply apparatus for a DC characteristic measurement or the like is generally included in the semiconductor testing apparatus, in which each constant current and each reference voltage are set on a software basis by a program or the like. Accordingly, appropriate constant currents and appropriate reference voltages can easily be set in any of the cases with LSI 206 structured in a MOS implementation, a TTL implementation and an ECL implementation. LSI 206 may be constituted by MOS transistors or bipolar transistors. Alternatively, LSI 206 may be structured in a BiCMOS implementation including both of the MOS transistors and the bipolar transistors.

The operation of switching elements 9, 10, 11, 12, 17, 18, 19 and 20 is controlled by a program language or a test pattern for use in test description of LSI 206. More specifically, switching control circuit 4 generates a necessary control signal in accordance with an input/output state pattern that indicates whether or not pin terminal 207 of LSI 206 is in an output state or an input state and in accordance with an expected output pattern by the program language or test pattern.

A description will first be made on an operation for inhibiting a reflection with undershoot that is generated when the logic level of an output of LSI 206 changes from logical one to logical zero. At this time, pin terminal 207 of LSI 206 is in an output state. Information indicating that pin terminal 207 is in the output state is written in the program language or test pattern for use in test description of LSI 206. Based on this information, switch control circuit 4 first turns switching element 205b on, to connect pin terminal 207 via transmission line 203 and node 208 to comparator 202. When pin terminal 207 is in the output state, there is a possibility that undershoot occurs on node 208. Thus, it is necessary to supply a current to stray capacitance 150 of transmission line 203. Switch control circuit 4 turns switching element 3 on based on the information indicating the output state of pin terminal 207. This causes node N4 of diode bridge 7 to be connected to node 208.

In order to verify that an output signal waveform of LSI 206 falls from logical one to logical zero by using a tester (semiconductor testing apparatus), a test pattern is provided which indicates that an expected value of the output signal of LSI 206 is logical zero and instructs a comparison between this logical zero signal and the output signal of LSI 206.

For example, if pin terminal 207 in the test pattern is in the output state and a symbol "L" is written in an expected pattern, switch control circuit 4 sets fast switching elements 17, 18, 19 and 12 in an ON state in accordance with such information. At this time, fast switching elements 9, 10, 11 and 20 are kept in an OFF state. Fast switching element 12 is turned on in first current supply circuit 5 for an overshoot countermeasure for the purpose of connecting first reference voltage source 8 and first constant current source 14 to provide a current path to a first constant current source 14.

The turning on of fast switching element 17 causes second reference voltage source 16 to be connected to diode bridge 7. Node N2 of diode bridge 7 is supplied with a reference voltage of −0.5 V by second reference voltage source 16. Second constant current source 21 normally supplies a current flow in the route from switching element 19 through switching element 18, diode 15c and switching element 17 to second reference voltage source 16.

Assume now that a voltage on node 208 is not more than −0.5 V. At this time, since a voltage on node N4 becomes lower than that on node N2, the current flow from second constant current source 21 is transmitted through switching elements 19, 18, diode 15d and switching element 3 to node 208. The current supplied from second constant current source 21 to node 208 charges stray capacitance 150 of transmission line 203, thereby raising the potential of undershoot at node 208.

When the voltage on node 208 becomes not less than −0.5 V, diode 15d is turned off, so that the current from second constant current source 21 flows through diode 15c and switching element 17 into second reference voltage source 16. The foregoing operation enables an inhibition of the undershoot at node 208.

For inhibition of overshoot, switching elements 9, 10, 11 and 20 are set in an ON state, while switching elements 12, 17, 18 and 19 are set in an OFF state under control by switch control circuit 4 in accordance with a program language or a test pattern (an input/output pattern and an expected pattern). Switching element 20 is turned on in second current supply circuit 6 for inhibiting undershoot for the purpose of connecting second constant current source 21 and second reference voltage source 16 to provide a path through which the current from second constant current source 21 flows.

A reference voltage applied by first reference voltage source 8 is set to +5.5 V. When a voltage on node 208 is lower than +5.5 V, diode 15a is in an OFF state, so that the current from first reference voltage source 8 flows through diode 15b and switching elements 10 and 11 to first constant current source 14.

When the voltage on node 208 becomes higher than +5.5 V, the voltage on node N4 becomes higher than the reference voltage of node N2. At this time, diode 15a is turned on, so that a current is supplied from first constant current source 14 through diode 15a and switching elements 10 and 11 to node 208. That is, in this case, a current is drawn from node 208 (stray capacitance 150). This causes a decrease in overshoot potential of node 208, thereby inhibiting the occurrence of overshoot at node 208.

A set value of a current value I supplied by first and second current sources 14 and 21 is obtained from the following equation:

$$I = (C/T) \cdot V_0 \cdot (R - Z_0)/(R + Z_0)$$

where C is a stray capacitance (denoted by capacitance 150 in FIG. 9) accompanied with the entire transmission line 203, R is an output resistance of LSI 206, Z0 is characteristic impedance of transmission line 203, V0 is an output voltage of LSI 206, and T is round-trip propagation delay time of transmission line 203.

That is, current supply circuits 5 and 6 should supply a current so that stray capacitance C of transmission line 203 may prevent an excess supply of the current by the reflection at node 208 during the round-trip time of the output signal from LSI 206 on transmission line 203.

Specifically, substituting such numeric values as C=60 pF, T=6nS, Z0=100Ω, V0=5 V and R=20Ω into the above equation, current value I provides 33 mA. Therefore, when the foregoing conditions are satisfied, if respective supply currents of first and second constant current sources 14 and 21 are set to −33 mA and +33 mA, then the overshoot and undershoot on transmission line 203 can be inhibited.

Figure 10:
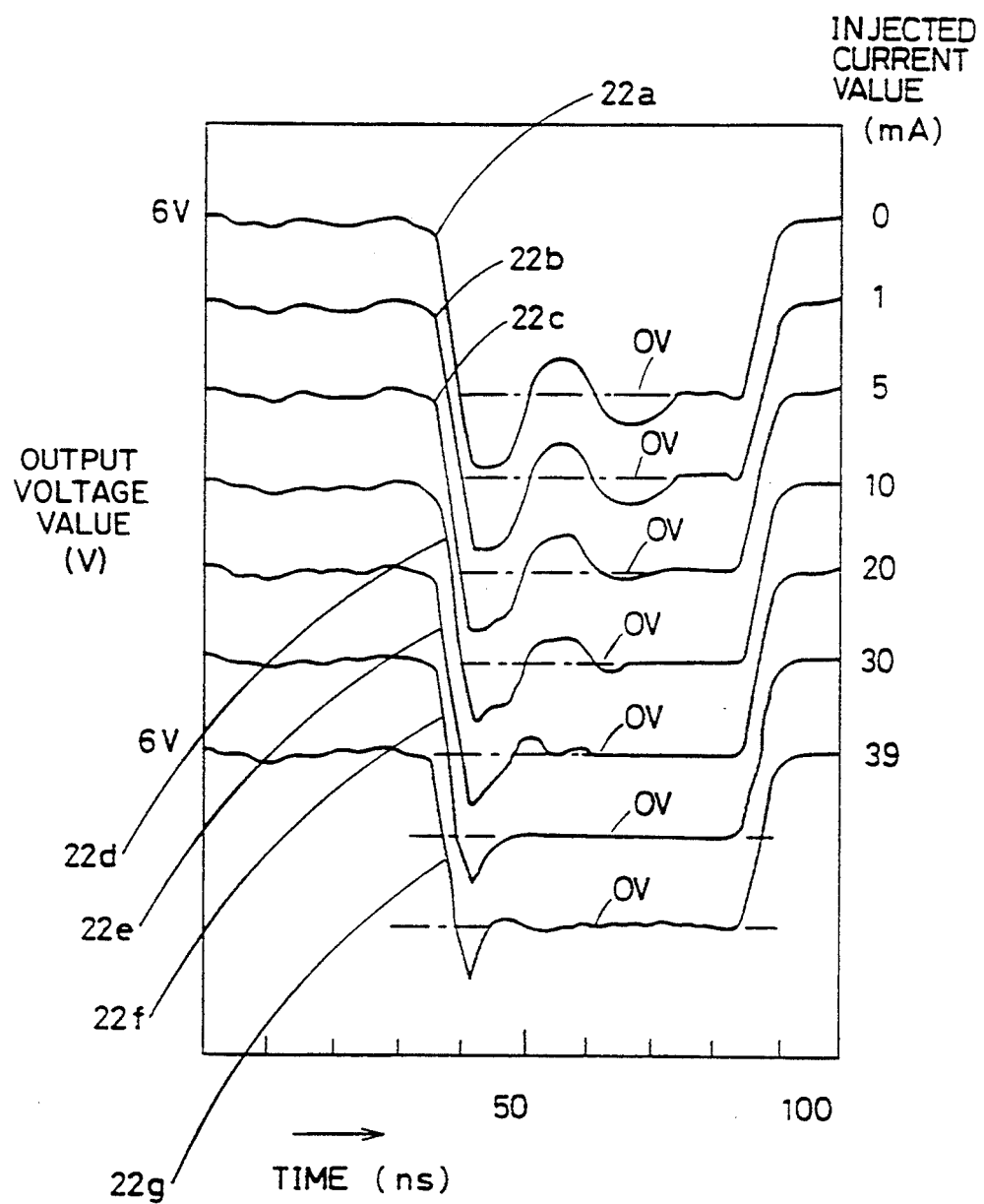
FIG. 10 is a diagram showing an undershoot inhibition effect provided in use of the semiconductor testing apparatus shown in FIG. 9.

Experiment data measured by using the above-described parameters is shown in FIG. 10. FIG. 10 is a diagram showing detection waveforms of comparator 202 (voltage waveforms on node 208) when current injection is carried out for the reflection with undershoot occurring in the case where the output signal waveform from LSI 206 changes from logical one to logical zero. In FIG. 10, the abscissa indicates time (units of nano second), and the ordinate indicates voltage (units of V).

Referring to FIG. 10, respective signal waveforms 22a-22g represent respective voltage waveforms on node 208 obtained when the values of the injected current for the transmission line are 0 mA, 1 mA, 5 mA, 10 mA, 20 mA, 30 mA and 39 mA, respectively. As apparent from FIG. 10, distortion of the waveforms is made smaller as the injected current values are made greater from 0 mA. The phenomenon that an occurrence of ringing is almost inhibited at the injected current value of 30 mA and that a slight ringing starts to occur again at the injected current value of 39 mA is due to the excess current supply from current supply circuit 6 for undershoot. FIG. 10 shows the case where LSI 206 is structured in a MOS implementation and its logic high level and its logic low level are 6 V and 0 V, respectively.

The foregoing current supply operation can be described generally as follows.

When undershoot occurs at node 208, the current from second constant current source 21 flows into either transmission line 203 or reference voltage source 16, depending on the magnitude of a voltage at an input terminal (node 208) of comparator 202 and a reference voltage applied by reference voltage source 16. Switching of this current path is made by diode bridge 7.

If the voltage at the input terminal (node 208) of comparator 202 is lower than the reference voltage applied by reference voltage source 16, the current set by second constant current source 21 flows through fast switching elements 19 and 18 and diode 15d into transmission line 203. If the voltage at the input terminal (node 208) of comparator 202 becomes higher than the reference voltage applied by reference voltage source 16, the current supplied by second constant current source 21 flows through fast switching elements 19 and 18 and diode 15c into second reference voltage source 16. At that time, if the voltage at the input terminal (node 208) of comparator 202 is higher than the reference voltage applied by second reference voltage source 16, no current is supplied to transmission line 203. During the occurrence of undershoot, if a current is supplied to stray capacitance 150 of transmission line 203 and its potential becomes higher than the reference voltage set by reference voltage source 16, the operation of supplying a current to transmission line 203 is stopped. In this case, the current supply operation of current supply circuit 6 merely functions to eliminate charges of capacitance distributed over the transmission line and hence exerts no influence on LSI 206.

Even if overshoot occurs at node 208, the same operation is carried out in current supply circuit 5 for an overshoot countermeasure. Accordingly, at the time of the occurrence of overshoot also, a current is merely supplied in a direction in which excess charges of parasitic capacitance (stray capacitance) 150 of transmission line 203 are eliminated, and hence no influence is exerted on LSI 206.

While resistor 204 for termination is provided in FIG. 9, this terminating resistor 204 need not be necessarily provided since switching element 205c is always turned off.

Figure 11:
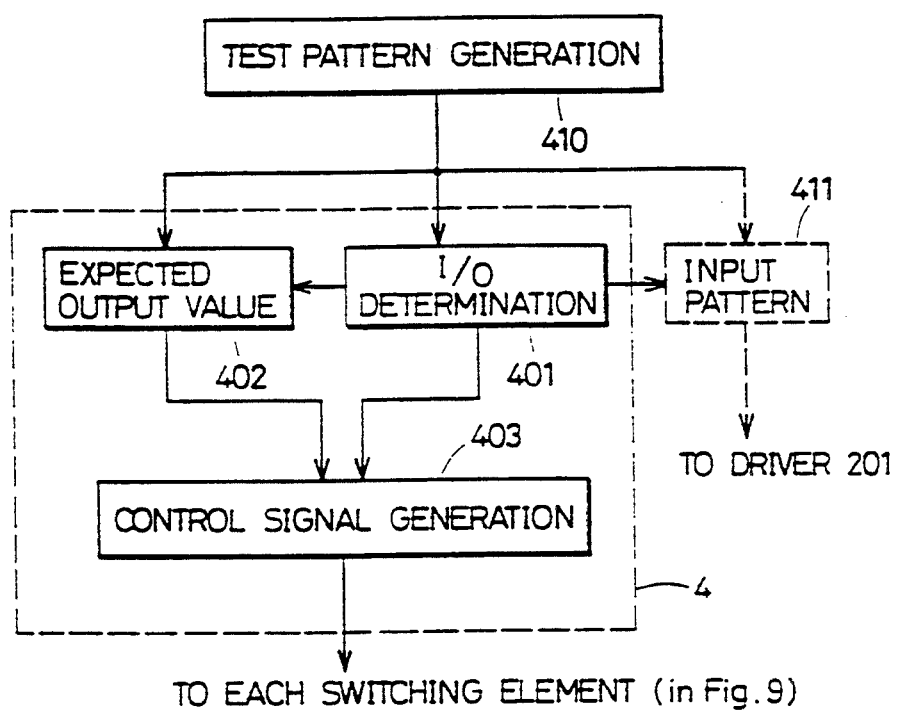
FIG. 11 is a block diagram functionally showing structure of a switch control circuit shown in FIG. 9.

FIG. 11 is a block diagram showing a functional configuration of switch control circuit 4 shown in FIG. 9. Switch control circuit 4 of FIG. 11 includes an input/output determining circuit 401 for receiving a test pattern from test pattern generator 410, to determine whether terminal 207 of the semiconductor device is in an input state or an output state, an expected output value storing circuit 402 for storing an expected output value included in the test pattern from test pattern generator 410 in accordance with a result of the determination from input/output determining circuit 401, and a control signal generating circuit 403 for generating a signal for controlling respective switches in response to signals from input/output determining circuit 401 and expected output value storing circuit 402. Switch control circuit 4 may include an input pattern generating circuit 411 for discriminating an input pattern out of the test pattern generated from test pattern generator 410 to apply the discriminated input pattern to driver 201 under control by input/output determining circuit 401.

Various test patterns generated from test pattern generator 410 are available. One of such test patterns is comprised of an expected pattern (including an input pattern and an output pattern), an I/O pattern (indicating whether data of each expected pattern is an input or an output) and a mask pattern (setting the expected pattern in a don't-care state). In that case, input/output determining circuit 401 discriminates an expected output value and an input pattern from the expected pattern by observing the I/O pattern. Expected output value storing circuit 402 responds to a signal from input/output determining circuit 401 to store the expected pattern as an expected output value therein. Input/output determining circuit 401 also observes the mask pattern and determines whether or not this observed expected pattern is in a don't-care state. Control signal generating circuit 403 generates a signal for controlling respective switching elements in response to a result of the determination from input/output determining circuit 401 and the expected output value stored in expected output value storing circuit 402.

When input/output determining circuit 401 indicates an output state and the expected output value is at a logic low level, there is a possibility that undershoot occurs at node 208. At this time, control signal generating circuit 403 generates a control signal so as to cause current supply circuit 6 for undershoot inhibition to function. Further, when input/output determining circuit 401 indicates the output state and the expected output value included in expected output value storing circuit 402 is at a logic high level, it is determined that there is a possibility of generating overshoot, so that control signal generating circuit 403 operates current supply circuit 5 for overshoot inhibition.

In the case where the test pattern generated from test pattern generator 410 provides a data pattern in which one data includes data indicating whether a driver is driven or not, an expected value of a comparator, data applied to the driver, a mask of the comparator and an expected value of high impedance, the data is comprised of a plurality of bits. In this case, looking at a predetermined bit makes it possible to determine whether pin terminal 207 is in an input state or an output state and whether undershoot or overshoot occurs at the input of the comparator. In such structure of the test pattern also, control signal generating circuit 403 can generate a control signal so as to inhibit the occurrence of undershoot and overshoot on transmission line 203. When such a test pattern is provided as a data stream, predetermined bits of each data are correspondingly transmitted to input/output determining circuit 401, expected output value storing circuit 402 and input pattern generating circuit 411, respectively.

Figure 12:
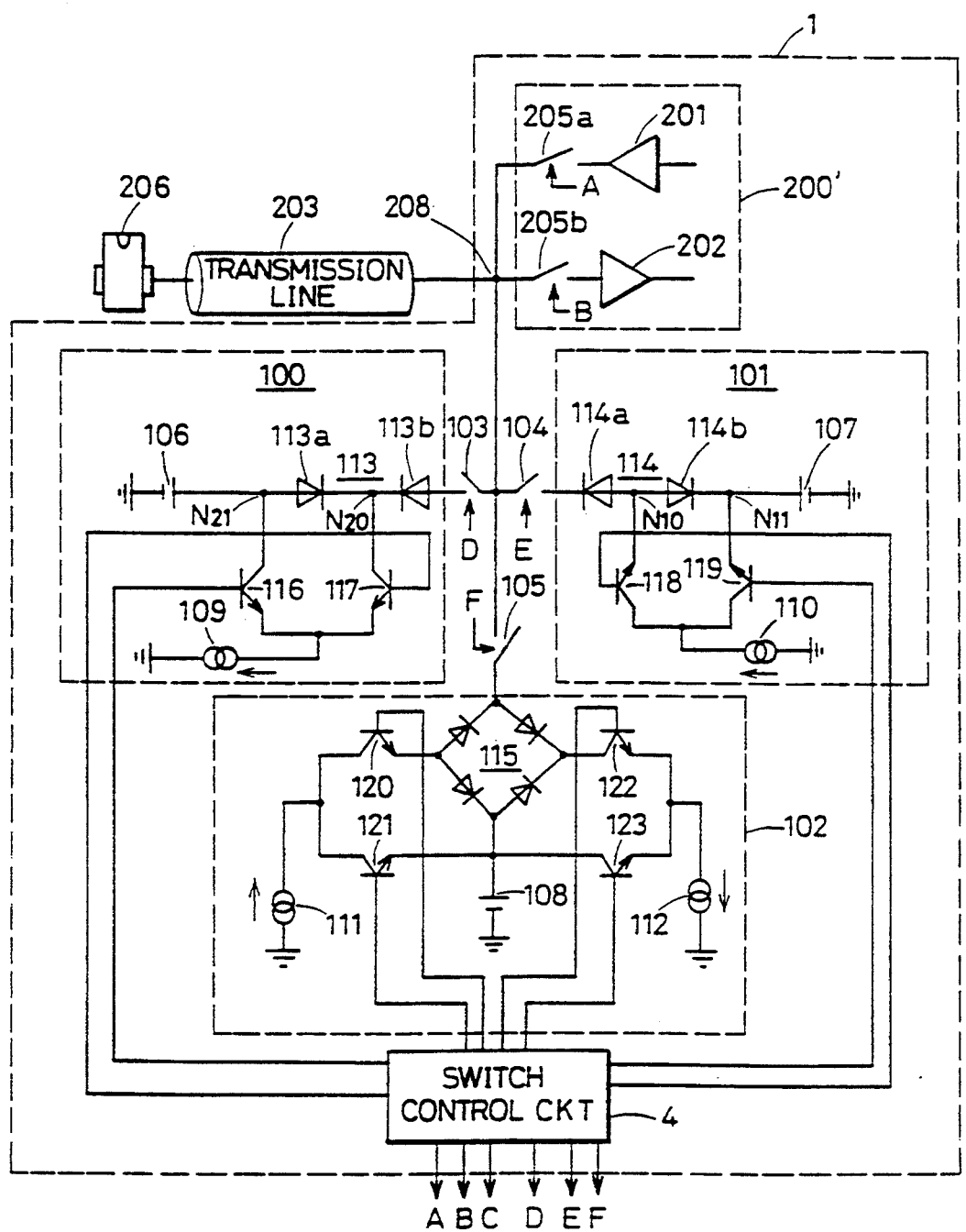
FIG. 12 is a circuit diagram showing structure of a semiconductor testing apparatus according to another embodiment of the present invention.

FIG. 12 is a diagram showing configuration of a pin electronics circuit being another embodiment of the present invention. Referring to FIG. 12, a pin electronics circuit 1 includes, in addition to driver 201 and comparator 202, a current supply circuit 101 for undershoot inhibition, a current supply circuit 100 for overshoot inhibition, and a dynamic load circuit 102 constituting a dummy load that applies a testing current load to an output of a semiconductor device in testing in a board level.

Current supply circuit 101 for undershoot includes a diode 114a having its cathode connected to a switching element 104 and its anode connected to a node N10, a diode 114b having its anode connected to node N10 and its cathode connected to a node N11, a reference voltage source 107 for applying a reference voltage in undershoot, and a constant current source 110 for supplying a current for undershoot protection through switch 104 to node 208. Diodes 114a and 114b constitute a diode bridge 114. Current supply circuit 101 further includes a fast switching element 118 comprised of, e.g., an NPN bipolar transistor that is turned on in response to a control signal from switch control circuit 4 to connect node N10 to constant current source 110, and a fast switching element 119 comprised of, e.g., an NPN bipolar transistor that is turned on in response to a control signal from switch control circuit 4 to connect node N11 to constant current source 110. A reference voltage applied by a reference voltage source 107 and a constant current supplied by constant current source 110 are identical to those of reference voltage source 16 and constant current source 21 included in current supply circuit 6 shown in FIG. 9.

Current supply circuit 100 for overshoot includes a diode 113a having its anode connected to a node N21 and its cathode connected to a node N20, a diode 113b having its anode connected to a switching element 103 and its cathode connected to node N20, a reference voltage source 106 for applying a reference voltage for overshoot, and a constant current source 109 for supplying a current for overshoot protection. Diodes 113a and 113b constitute a diode bridge 113.

A reference voltage and a constant current applied respectively by reference voltage source 106 and constant current source 109 are identical to those of reference voltage source 8 and constant current source 14 shown in FIG. 9. Reference voltage source 106 has its one electrode connected to node N21. Current supply circuit 100 further includes a fast switching element 116 comprised of, e.g., an NPN bipolar transistor that is turned on in response to a control signal from switch control circuit 4 to connect node N21 to constant current source 109, and a fast switching element 117 comprised of, e.g., an NPN bipolar transistor that is turned on in response to a control signal from switch control circuit 4 to connect node N20 to constant current source 109.

Dynamic load circuit 102 includes a reference voltage source 108 for generating a reference voltage, a constant current source 111 for supplying a load current when a signal appearing on node 208 is logical zero, a constant current source 112 for applying a current load when a signal appearing on node 208 is logical one, a diode bridge 115 for switching a current path in accordance with a voltage appearing on node 208, and fast switching elements 120, 121, 122 and 123 each comprised of, e.g., NPN bipolar transistors that are turned on in response to a control signal from switch control circuit 4, so as to be set in an ON/OFF state in accordance with the logic level of a signal voltage appearing on node 208.

Dynamic load circuit 102 applies a current load to a semiconductor device 206 for measuring whether or not device 206 has a predetermined current handling capability. That is, in the case of semiconductor device 206 in a CMOS implementation, no load is provided on the counterpart of an output of the semiconductor device in a board level. Thus, a current load is applied to semiconductor device 206 by driving dynamic load circuit 102 fictitiously. In the case of a semiconductor device in a MOS implementation, for example, with respect to specification values, it is necessary that such a semiconductor device has a current handling capability of 1 mA when its signal is at a logic high level, i.e., a voltage level within 4.5 V through 5 V and that the device has a current handling capability of 4 mA when its voltage signal is at a logic low level, i.e., a voltage value in the range of 0 V to 0.8 V. Dynamic load circuit 102 is provided to measure such current handling capabilities.

For dynamic load circuit 102, current source 111 supplies a constant current of e.g., 4 mA, and constant current source 112 supplies a constant current of −1 mA. At this time, reference voltage source 108 is set at, e.g., 2.5 V, an intermediate potential of a MOS level. When a potential on node 208 becomes higher than a reference voltage set by reference voltage source 108, the function of diode bridge 115 causes a current to be supplied through fast switching element 122 to constant current source 112. When a voltage on node 208 is lower than the reference voltage applied by reference voltage source 108, the function of diode bridge 115 causes a current to be supplied through fast switching element 120 by constant current source 111. Fast switching elements 120 and 123 are turned on simultaneously, while switching elements 121 and 122 are turned on simultaneously. Switching elements 120 and 122 are turned on complementarily. A detailed explanation on the operation of dynamic load circuit 102 itself will not be given since the operation thereof does not directly affect the operation of inhibiting overshoot and undershoot according to the present invention. The dynamic load circuit is described in the aforementioned conventional art reference, "Modern ATE" by R. M. Barber. A constant current value and a reference voltage value provided by dynamic load circuit 102 are set on a software basis.

Description will now be made only on operation of current supply circuits 100 and 101 with respect to the operation of the pin electronics circuit shown in FIG. 12. When there is a possibility of generating overshoot on node 208, i.e., an expected value of an output signal from semiconductor device 206 is at a logic high level, switching elements 103 and 104 are turned on and off, respectively in response to control signals D and E from switch control circuit 4. This causes current supply circuit 100 to be connected to node 208. At this time, switching elements 117 and 116 are turned on and off, respectively. This causes node N20 of diode bridge 113 to be connected to constant current source 109.

When a voltage on node 208 becomes higher than a reference voltage set by reference voltage source 106, diode 113b is turned on and diode 113a is turned off. Responsively, a current flows in the route from node 208 through switching element 103, diode 113b and switching element 117 to constant current source 109. This causes a potential on node 208 to fall. If the voltage on node 208 becomes lower than the reference voltage applied by reference voltage source 106, then diodes 113a and 113b are turned on and off, respectively, so that a current flows in the route from reference voltage source 106 through diode 113a and transistor switching element 117 to constant current source 109.

At this time, in current supply circuit 101, transistor 118 and switching element 119 are set in an OFF state and an ON state, respectively, and a current is supplied from reference voltage source 107 through switching element 119 to constant current source 110.

When there is a possibility that undershoot occurs on node 208, switching elements 103 and 104 are set in an OFF state and an ON state, respectively. Further, switching elements 118 and 119 are turned on and off, respectively. Switching elements 116 and 117 are turned on and off, respectively in current supply circuit 100. If the voltage on node 208 is lower than the reference voltage applied by reference voltage source 107, diode 114a is turned on, while diode 114b is turned off, so that a current is supplied from constant current source 110 through switching element 104, diode 114a and switching element 118 to node 208. If the voltage on node 208 is higher than the reference voltage applied by reference voltage source 107, diode 114a is turned off, so that a current from reference voltage source 107 flows in the route from diode 114b through switching element 118 to constant current source 110.

Even if the respective supply circuits for undershoot inhibition and overshoot inhibition are provided independently of each other as described above, the switching elements operate at high speed, whereby the occurrence of undershoot and overshoot on node 208 can be inhibited at high speed.

In the foregoing embodiments, the problem is directed to the inhibition of overshoot and undershoot caused by the reflection of a signal at node 208 when the characteristic impedance of transmission line 203 is higher than the output impedance of semiconductor device 206 under test. However, those current supply circuits effectively function not only for the reflection caused by impedance mismatching of transmission line 203 but for ringing due to electric characteristics (L (inductance), R (resistance) and C (capacitance)) distributing in a concentrated constant manner in transmission line 203, thereby enabling the inhibition of the occurrence of ringing.

As the constitution of semiconductor device 206 under test, the device is not limited to a logic circuit and may be a storage device or the like. In general, any one of the logic circuit and the storage device, which undergoes a test after production of the device may be applied. In addition, a constituent element thereof is not limited to a MOS transistor and may be any one of a bipolar transistor and a BiCMOS implementation including both the bipolar transistor and the MOS transistor.

As has been described heretofore, according to the present invention, a voltage of an input of means for determining the logic level of an output signal of the semiconductor device under test is compared with a reference voltage, and a current is supplied to the input of the determining means based on a result of the comparison, whereby inhibition of the occurrence of overshoot, undershoot and ringing on the transmission line is ensured.

Ensuring the inhibition of the occurrence of reflection and ringing on the transmission line makes it possible to inhibit occurrence of noise such as a cross talk and carry out a test for the semiconductor device accurately and surely at high speed.

The current value of the current supplied by the current supply circuits and the voltage value of the reference voltage can be set by programming the same as with the constant current source and the reference voltage source included in the dynamic load circuit. Also, it is unnecessary to provide a terminating resistance or carry out soldering on a board in adding the terminating resistance or the like. This results in a semiconductor testing apparatus with a simple circuit configuration that ensures a testing and a characteristic measurement of a semiconductor device without increasing operation steps.

Moreover, since the constant current source and the reference voltage source can be set by program as described above, an economical semiconductor testing apparatus with a shorter turnaround time is obtained. Further, since such a testing apparatus can be employed in various types of semiconductor devices, a pin electronics circuit that does not require manufacture of a dedicated board can be obtained. Since it is unnecessary to manufacture such a dedicated board, an inexpensive semiconductor testing apparatus can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of testing a semiconductor device operating according to predetermined testing information, comprising the steps of:
    receiving an output signal of said semiconductor device through a signal transmission line;
    generating a reference voltage in accordance with an expected logical level of said output signal;
    comparing said reference voltage and a voltage of the output signal thus received;
    supplying a current flow to said signal transmission line in accordance with the result in said step of comparing; and
    determining a logical level of said output signal thus received; and
    deciding whether the semiconductor device operates correctly according to the result of determination in said step of determining.

2. A method of testing a semiconductor device according to claim 1, wherein said expected logical level includes a first logical level and a second logical level, and wherein said step of generating includes the steps of generating a first reference voltage corresponding to said first logical level when said expected logical level of the output indicates said first logical level, and generating a second reference voltage corresponding to said second logical level when said expected logical level of the output signal indicates said second logical level.

3. A method of testing a semiconductor device according to claim 1, wherein said expected logical level includes a first logical level and a second logical level, and wherein said step of supplying includes the steps of injecting said current flow to said transmission line where said expected logical level indicates the first logical level, and extracting said current flow from said transmission line where said expected logical level indicates the second logical level.

4. A method of testing a semiconductor device operating according to predetermined testing information, comprising the steps of:
receiving an output signal of said semiconductor device at an input node through a signal transmission line;
coupling a current flow source to said signal transmission line where there is a possibility of occurrence of an undershooting on said signal transmission line at said input node, in accordance with an expected logical level of the output signal;
coupling a current flow sink to said transmission line at said input node where there is a possibility of occurrence of an overshooting on said transmission line at said input node, in accordance with the expected logical level of the output signal;
determining a logical level of the output signal received at input node, after substantially stabilizing a potential level of the output signal at said input node; and
deciding whether said semiconductor device operates correctly according to the result of determination in said step of determining.

5. In an apparatus for testing normal operation of a semiconductor device including a pin electronics circuit having an input node and a signal transmission line connecting said input node to said semiconductor device, a method of reducing undershooting or overshooting on said signal transmission line at said input node during testing of said semiconductor device when an impedance of said signal transmission line is higher than an output impedance of said semiconductor device, comprising the steps of:
receiving an output signal of said semiconductor device at said input via said signal transmission line;
generating a reference voltage in accordance with an expected logical level of said output signal;
comparing said reference voltage and a voltage of the output signal thus received;
supplying a first current flow to said signal transmission line at said input node in accordance with the result in said step of comparing to reduce undershooting on said signal transmission line at said input node;
supplying a second current flow to said signal transmission line at said input node in accordance with the result in said step of comparing to reduce overshooting on said signal transmission line at said input node; and
determining the logical level of said output signal thus received at said input node after substantially stabilizing a potential level of the output signal at said input node.

6. A method of reducing generation of undershoot or overshoot according to claim 5, wherein said expected logical level includes a first logical level and a second logical level, and wherein said step of generating a reference voltage includes the steps of generating a first reference voltage corresponding to said first logical level when said expected logical level of the output indicates said first logical level, and generating a second reference voltage corresponding to said second logical level when said expected logical level of the output signal indicates said second logical level.

7. A method of reducing generation of undershoot or overshoot according to claim 5, wherein said expected logical level includes a first logical level and a second logical level, and wherein said step of supplying includes the steps of injecting said current flow to said transmission line where said expected logical level indicates the first logical level, and extracting said current flow from said transmission line where said expected logical level indicates the second logical level.

8. In an apparatus for testing normal operation of a semiconductor device including a pin electronics circuit having an input node and a signal transmission line connecting said input node to said semiconductor device, a method of reducing undershooting or overshooting on said signal transmission line at said input node during testing of said semiconductor device when an impedance of said signal transmission line is higher than an output impedance of said semiconductor device, comprising the steps of:
receiving an output signal of said semiconductor device at said input via said signal transmission line;
coupling a current flow source to said signal transmission line at said input node where there is a possibility of occurrence of an undershooting on said signal transmission line at said input node, in accordance with an expected logical level of the output signal;
coupling a current flow sink to said signal transmission line at said input node where there is a possibility of occurrence of an overshooting on said signal transmission line at said input node, in accordance with an expected logical level of the output signal; and
determining a logical level of the output signal received at said input node, after substantially stabilizing a potential level of the output signal at said input node.

9. A method of determining a logical level of an output signal of a semiconductor device operating according to predetermined testing information, comprising the steps of:
receiving an output signal of said semiconductor device through a signal transmission line;
generating a reference voltage in accordance with an expected logical level of said output signal;
comparing said reference voltage and a voltage of the output signal thus received; and
supplying a current flow to said signal transmission line in accordance with the result in said step of comparing; and
determining a logical level of said output signal thus received.

10. A method of determining a logical level of an output signal of a semiconductor device operating according to predetermined testing information, comprising the steps of:
receiving an output signal of said semiconductor device at an input node through a signal transmission line;
coupling a current flow source to said transmission line where there is a possibility of occurrence of an undershooting on said transmission line at said input node, in accordance with an expected logical level of the output signal;

coupling a current flow sink to said signal transmission line at said input node where there is a possibility of occurrence of an overshooting on said signal transmission line at said input node, in accordance with the expected logical level of the output signal; and determining a logical level of the output signal received at input node, after substantially stabilizing a potential level of the output signal at said input node.

* * * * *